US007026971B2

(12) United States Patent
Horsky et al.

(10) Patent No.: US 7,026,971 B2
(45) Date of Patent: Apr. 11, 2006

(54) MONOTONIC PRECISE CURRENT DAC

(75) Inventors: Pavel Horsky, Brno (CZ); Ivan Koudar, Slapanice U Brna (CZ)

(73) Assignee: AMI Semiconductor Belgium BVBA, Oudenaarde (BE)

( * ) Notice: Subject to any disclaimer, the term of this patent is extended or adjusted under 35 U.S.C. 154(b) by 121 days.

(21) Appl. No.: 10/810,328

(22) Filed: Mar. 26, 2004

(65) Prior Publication Data
US 2004/0263373 A1 Dec. 30, 2004

(30) Foreign Application Priority Data
Mar. 31, 2003 (EP) ................ 03447074

(51) Int. Cl.
H03M 1/66 (2006.01)
(52) U.S. Cl. ...................... 341/145; 341/145
(58) Field of Classification Search ................ 341/145
See application file for complete search history.

(56) References Cited

U.S. PATENT DOCUMENTS

| 4,292,625 | A |   | 9/1981  | Schoeff          |         |
|-----------|---|---|---------|------------------|---------|
| 4,739,304 | A |   | 4/1988  | Katakura et al.  |         |
| 5,446,457 | A | * | 8/1995  | Ryat             | 341/136 |
| 5,568,146 | A |   | 10/1996 | Park             |         |
| 5,703,586 | A | * | 12/1997 | Tucholski        | 341/144 |
| 5,781,140 | A | * | 7/1998  | Kao              | 341/154 |
| 5,841,384 | A |   | 11/1998 | McKay et al.     |         |
| 5,844,511 | A |   | 12/1998 | Izumikawa        |         |
| 6,037,888 | A |   | 3/2000  | Nairn            |         |
| 6,329,940 | B1|   | 12/2001 | Dedic            |         |
| 6,329,941 | B1|   | 12/2001 | Farooqi          |         |

(Continued)

FOREIGN PATENT DOCUMENTS

EP    0 359 315    3/1990

(Continued)

OTHER PUBLICATIONS

Chin et al., "A 10-b 125 MHz CMOS Digital-to-Analog Converter DAC with Threshold Voltage Compensated Current Sources," IEEE Journal Solid State Circuits, pp. 1374-1380, Nov. 11, 1994.

(Continued)

Primary Examiner—Linh V. Nguyen
(74) Attorney, Agent, or Firm—Trop, Pruner & HU, PC

(57) ABSTRACT

A monotonic digital-to-analog converter (DAC) for converting a digital input signal into an analog output signal comprises:
an input node for receiving the digital input signal having at least M+L bits,
an output node for delivering the analog output signal corresponding to the received digital input signal,
a coarse conversion block comprising current sources and first switching means for converting M more significant bits of the digital input signal into a coarse block output current,
a fine conversion block comprising a current divider and second switching means for converting L less significant bits of the digital input signal into a corresponding current value, the fine conversion block having means for receiving current from a first unselected current source of the coarse conversion block, and
a first cascode means for active cascoding the coarse block output current,
a second cascode means, for active cascoding the current from the first unselected current source.

A method for converting a digital input signal into an analog output signal is also provided.

12 Claims, 2 Drawing Sheets

U.S. PATENT DOCUMENTS

| | | | |
|---|---|---|---|
| 6,424,283 B1 * | 7/2002 | Bugeja et al. | 341/145 |
| 6,507,304 B1 | 1/2003 | Lorenz | |
| 6,583,744 B1 * | 6/2003 | Bright | 341/145 |
| 6,879,276 B1 * | 4/2005 | Devendorf et al. | 341/144 |
| 6,906,652 B1 * | 6/2005 | Bugeja | 341/145 |
| 2003/0016086 A1 | 1/2003 | Yang | |

FOREIGN PATENT DOCUMENTS

| | | |
|---|---|---|
| EP | 0 397 240 | 11/1990 |

OTHER PUBLICATIONS

Sumanen et al., "A 10-bit High-Speed Low-Power CMOS D/A Converter in 0.2 mm," Electronics, Circuits and Systems, 1998 IEEE International Conference on Lisboa, Portugal, pp. 15-18, Sep. 7, 1998.

Communication Pursuant to Article 96(2) EPC, pp. 1-6 (Oct. 13, 2005).

* cited by examiner

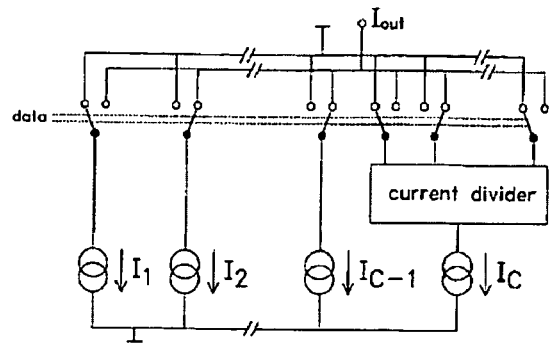
Fig. 1 - PRIOR ART
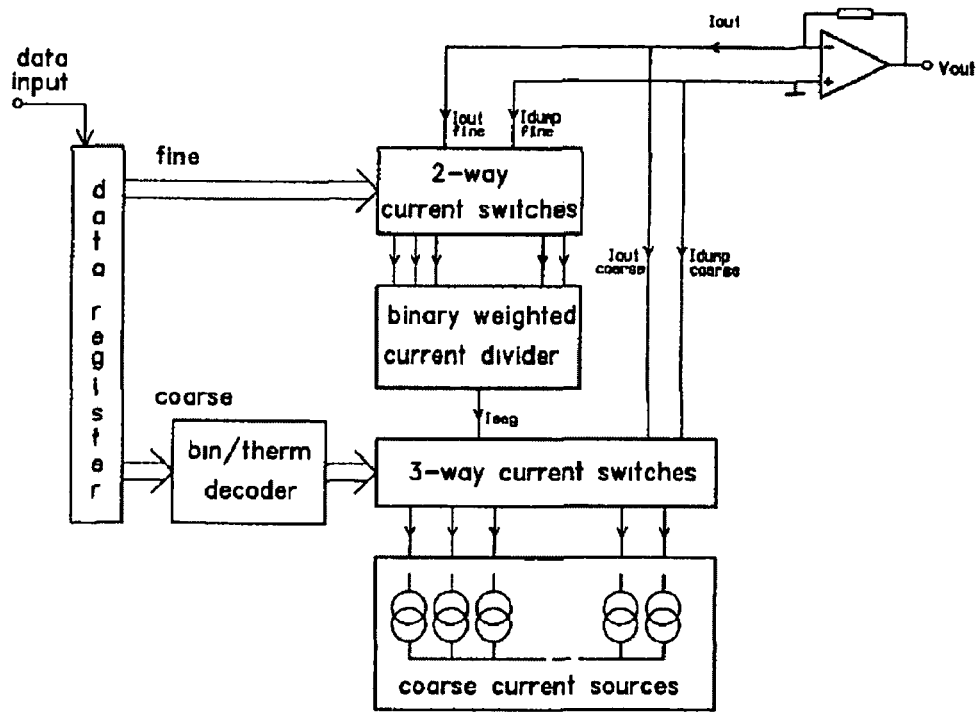
Fig. 2 - PRIOR ART
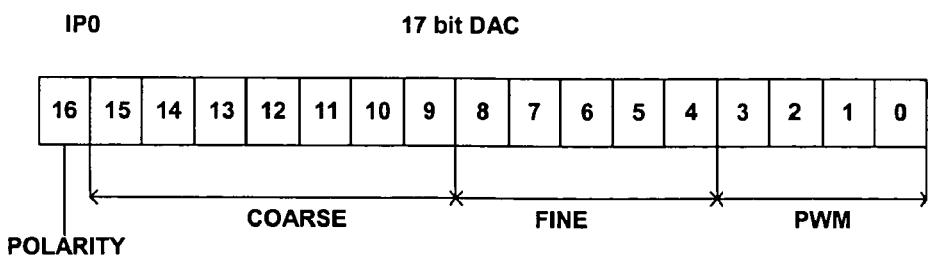
Fig. 4

MONOTONIC PRECISE CURRENT DAC

TECHNICAL FIELD OF THE INVENTION

The present invention relates to data conversion, and more particularly to a method of digital-to-analog (D/A) data conversion and corresponding digital-to-analog data converters (DACs).

BACKGROUND OF THE INVENTION

Description of prior art monotonic DAC can be found in H. J. Schouwenaars et al., "A low-power stereo 16-bit CMOS D/A converter for digital audio", IEEE J. Solid-State Circuits, vol. 23, no. 6, pp. 1290–1297, December 1988.

A basic diagram of a segmented current dividing DAC is shown in FIG. 1. An array of C linearly weighted coarse current sources is used. To increase the resolution, one of the current sources, in the case presented in FIG. 1 current source $I_c$, can be divided into more fine levels by a passive current divider. Depending on the value of the data signal, a number of the currents are switched to the output terminal $I_{out}$, and the remaining currents are dumped to signal ground.

To guarantee monotonicity of such a DAC, a principle as shown in FIG. 2 may be used. The coarse current sources are connected to three way switches. A decoder transforms the binary information of the most significant bits of the digital input signal into a thermometer code, which controls the coarse current switches. The first unselected coarse current source is connected by the three way switches to a fine bit divider stage, which divides the applied current into binary weighted current levels. These binary currents are switched to the output line by two-way switches controlled by the least significant bits. The coarse and fine output currents are added, thus forming an output current signal which is converted to an output voltage which is an analog equivalent of the digital input signal.

EP 0 359 315 discloses a digital-to-analog converter comprising a current source arrangement. The current source arrangement comprises a number of current sources and a switching network. The most significant bits of a digital input are sent to a first block comprising a decoding device, a current source for generating substantially equal currents and a switching network comprising two-way switches. A current coming from the first block is then sent to the second block comprising a current dividing circuit and a switching network. The current dividing circuit supplies the currents for the 10 least significant bits. The 10 least significant bits directly control the switches of the switching network.

The above described DAC's have a voltage output. If it is desired to obtain a current output, then the amplifier converting the current output to a voltage output may be left out. However, when doing this and when working in a wide range of output voltages, the current output is not precise due to a changing voltage at the outputs of coarse and fine blocks.

In U.S. Pat. No 4,292,625 a monotonic digital-to-analog converter is described for converting a binary number in an analog signal. The converter comprises a segment generator and a step generator. The segment generator is disposed for providing a first signal proportional to the values of the most significant digits of the binary numbers. Further, a step generator is disposed for providing a second signal proportional to the values of the least significant digits of the same binary numbers. Additionally, means for combining the first and second signals is provided to form an analog signal proportional to the value of the binary number to be converted. The output of the converter is a current.

SUMMARY OF THE INVENTION

It is an object of the present invention to provide a DAC which delivers a current output which can be used in a wide range of output voltages.

The above objective is accomplished by a method and device according to the present invention.

The present invention provides a monotonic digital-to-analog converter (DAC) for converting a digital input signal into an analog output signal. The converter comprises:
an input node for receiving the digital input signal having at least M+L bits,
an output node for delivering the analog output signal corresponding to the received digital input signal,
a coarse conversion block comprising current sources and first switching means
for converting M more significant bits of the digital input signal into a coarse block output current,
a fine conversion block comprising a current divider and second switching means for converting L less significant bits of the digital input signal into a corresponding current value, the fine conversion block having means for receiving current from a first of N unselected current sources of the coarse conversion block, and the monotonic digital-to analog converter furthermore comprises:
a first cascode means for active cascoding the coarse block output current, and
a second cascode means for active cascading the current from the first unselected current source.

It is an advantage of the present invention that the coarse block current outputs connected to the fine block and to the output node see the same voltage, so that monotonicity is not offended.

The first switching means may consist of two switching devices with three states: two ways where the current can flow (switching to the output node or switching to the fine conversion block) and one open state (no current can flow; preferably current sources are switched OFF).

Alternatively, the first switching means may be three way switches, i.e. there are three ways where the current can flow: switching to the output node, switching to the fine conversion block and switching to the power supply level or to another voltage level. Also three way switches with four states may be used: three ways where the current can flow (switching to the output node, switching to the fine conversion block or switching to a complementary output node), and one open state (no current can flow, preferably the current sources are switched OFF).

Unselected current sources in the coarse conversion block other than the unselected current source which sends current to the fine conversion block may be switched off in order to save power consumption.

The coarse conversion block may comprise linearly weighted current sources. The fine conversion block may comprise a linearly weighted current divider for dividing the current coming from the coarse conversion block.

The monotonic digital-to-analog converter according to the present invention may furthermore be provided with means for carrying out pulse width modulation (PWM). The PWM may be applied to an unselected fine bit, for example the first unselected fine bit in order to keep monotonicity.

A monotonic digital-to-analog converter according to the present invention may furthermore comprise an output follower loop for buffering the voltage on the output node.

The present invention also provides a method for converting a digital value comprising at least M+L bits into an analog value. The method comprises:

selecting a first number of current sources in the coarse conversion block, the first number depending on the value of M more significant bits of the digital value, switching current of the selected current sources in the coarse conversion block to an output node, switching current from an unselected current source in the coarse conversion block to a fine conversion block, dividing the current from the switched unselected current source over a current divider in the fine conversion block, selecting a second number of current outputs in the fine conversion block, the second number depending on the value of L less significant bits of the digital value, switching current of the selected current outputs in the fine conversion block to the output node, active cascoding the coarse block output current, and active cascoding the current of a first of N unselected current sources in the coarse conversion block.

A method according to the present invention may further comprise applying pulse width modulation on current from an unselected current source in the fine conversion block, and switching this pulse width modulated current to the output node.

A method according to the present invention may furthermore comprise switching off unselected current sources in the coarse conversion block, other than the unselected current source that sends current to the fine conversion block.

Dividing the current from the switched unselected current source in the coarse conversion block over a current divider in the fine conversion block may comprise linearly weighted dividing of said current.

A method according to the present invention may furthermore comprise buffering a voltage on the output node.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 1 is a schematic circuit diagram of a current dividing DAC according to the prior art.

FIG. 2 is a block diagram of a segmented DAC according to the prior art.

FIG. 4 illustrates and example of separation between coarse and fine blocks and PWM modulation.

Figure 3:
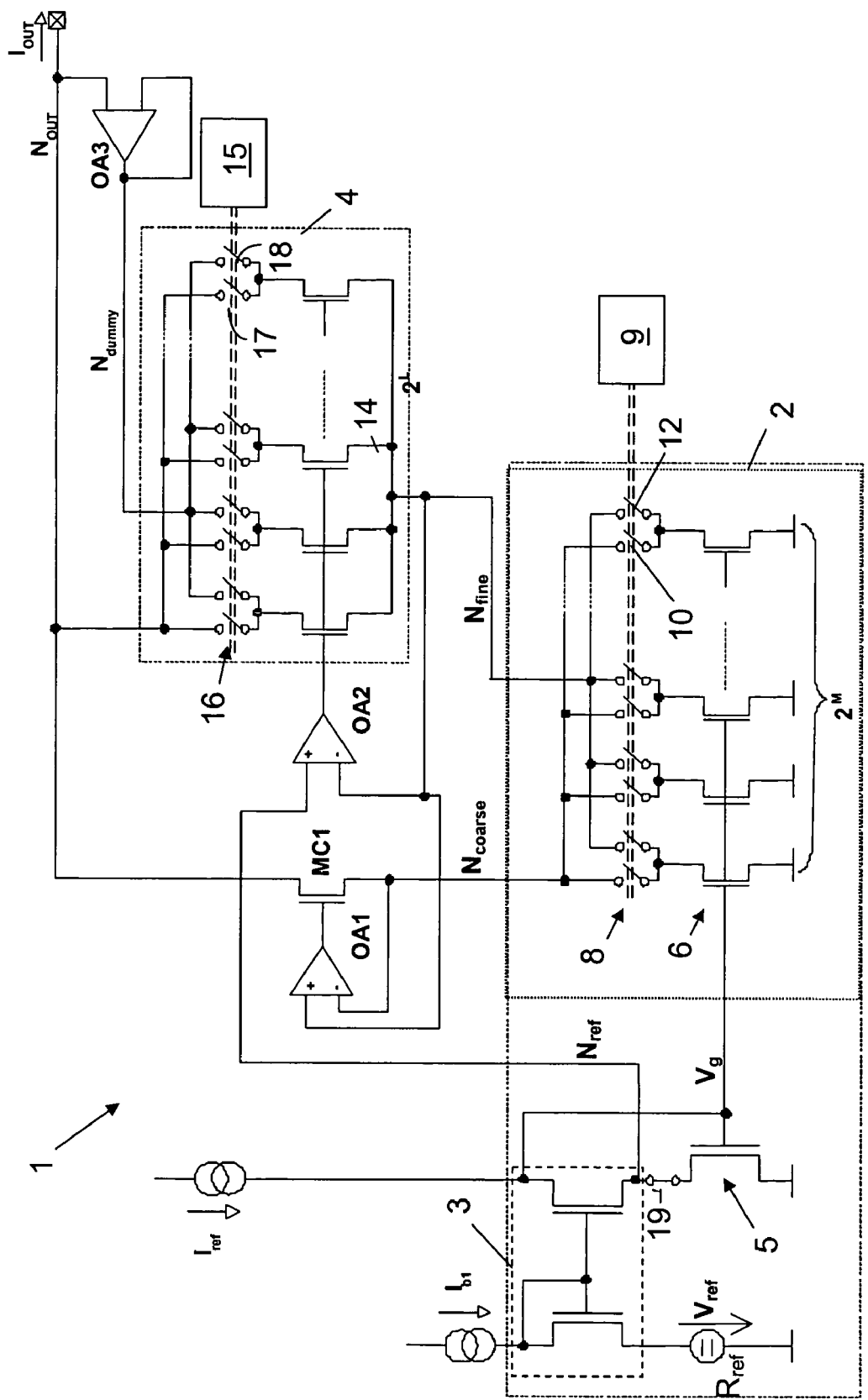
FIG. 3 is a block diagram of a current DAC according to an embodiment of the present invention.

In the different figures, the same reference figures refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The diagram of FIG. 3 shows the principles of a DAC 1 according to an embodiment of the present invention. This DAC 1 is a current DAC, i.e. it utilises current sources controlled by a digital input signal value which is being converted into an analog equivalent. The output of the DAC 1 according to the present invention is a current signal.

The DAC 1 according to the present invention is a segmented or dual DAC for conversion of a digital word or signal having a number of bits into an analog value. As a first embodiment, a DAC 1 for converting a digital word having M+L bits is considered.

At the left hand side of FIG. 3, a reference voltage $V_{ref}$, for example 0.5 Volts, is generated, for example by a current $I_{b1}$ which is sent through a reference resistor $R_{ref}$. The current $I_{b1}$ is chosen proportional to the value of the resistance $R_{ref}$, and therefore is preferably generated on-chip. As the current $I_{b1}$ is only used for generating the reference voltage $V_{ref}$, it does not need to be highly accurate. Instead of a current flowing to a reference resistor $R_{ref}$, any voltage source can be used for $V_{ref}$.

It is tried to keep the same voltage $V_{ref}$ at node $N_{ref}$ by means of a source follower circuit 3, comprising an input transistor and an output transistor. At the side of the output transistor of the source follower circuit 3, a reference input current $I_{ref}$ flows through a diode 5. This diode 5 may comprise a number of transistors, e.g. eight transistors. $I_{ref}$ is proportional to the number of transistors in the diode 5. The overall precision of the DAC depends on this current $I_{ref}$, therefore this current $I_{ref}$ needs to be very precise. At the gate of the transistors in the diode 5, a voltage $V_G$ is generated. The gates of the transistors of the diode 5 are connected to the drain of the output transistor of the source follower circuit 3 in order to provide a low voltage drop circuit. A conventional current mirror, without connection between the gates of the transistors of the diode 5 and the drain of the output transistor of the source follower circuit 3, may also be used, but in that case another output voltage range is obtained.

A first block, a coarse block 2, provides a coarse conversion of a part of the input digital signal by means of switching means, such as e.g. switching transistors, controlled by a decoder decoding the M most significant bits of the digital signal having M+L bits. A second block, a fine block 4, provides a fine conversion in response to the L least significant bits of the digital signal. The use of a coarse (M-bit) converter cascaded with a fine (L-bit) converter instead of an N-bit converter (wherein N=M+L) produces a very great saving in the number of devices which are required for the conversion, and accordingly a very great saving in the area of the converter.

Coarse block 2 comprises a number of current sources 6. If the course block 2 is provided for conversion of M bits of the incoming digital signal, then it comprises $2^M$ current sources 6; for example for conversion of a 7-bits signal, 128 current sources are needed. In the embodiment described with respect to FIG. 3, the current sources 6 are transistors, the gates of which are connected to the gates of the transistors forming the diode 5. The current sources are formed as linearly weighted, low voltage drop, current mirrors. This decreases matching requirements for the transistors forming the current sources 6. The currents delivered by the current sources 6 of the coarse block 2 are thus substantially equal to each other. By providing current sources 6 which each provide substantially the same amount of current and controlling these currents by a thermometer signal, a monotonic converter is provided. Linearly weighted converters require more switches and/or more current sources than binary weighted converters (wherein each current source provides a different amount of current, each value being a binary two multiple) to implement the same resolution. However, monotonic converters are characterised by the fact that, when increasing input signal values are applied to the converter, the output never decreases in value. Although binary weighted converters can be monotonic if a high enough precision of the current sources is provided, they are often not monotonic due to errors in precisely implementing each current source value. To create a monotonic binary weighted converter requires high accuracy for all current sources mainly for higher number of bits, on the other hand a linearly weighted converter is intrinsically monotonic. In coarse block 2 as shown in FIG. 3, the reference current $I_{ref}$ is mirrored to each of the current sources 6, which each deliver a current $I_{ref}$ or a part or a multiple thereof, depending on the number and the dimensions of the transistors forming the current sources 6.

Coarse block 2 furthermore comprises a number of switching devices 8. On the outputs of the current sources 6 of the coarse block 2, two way switches 8 are used, according to one embodiment, as represented in FIG. 3. Such two way switch 8 provides two ways in which the current can flow, and one open state. Therefore, each two way switch 8 comprises two switches 10, 12.

A first switch 10 is controlled by a thermometer code delivered by a binary-to-thermometer converter part of a converting means 9. A binary-to-thermometer converter has a data input for receiving M bits of the digital input signal to be converted into an analog signal, where M is an integer. The M bits represent the most significant bits of the digital input signal which is desired to be converted to an equivalent analog value. The binary-to-thermometer converter provides a conventional conversion from binary code to thermometer code. For facilitating the understanding of such converter, an example of the conventional binary-to-thermometer code conversion is provided in table 1 for three input bits (M=3).

| Binary input | Thermometer output | Code 1 of Nc |
|---|---|---|
| 000 | 00000000 | 00000001 |
| 001 | 00000001 | 00000010 |
| 010 | 00000011 | 00000100 |
| 011 | 00000111 | 00001000 |
| 100 | 00001111 | 00010000 |
| 101 | 00011111 | 00100000 |
| 110 | 00111111 | 01000000 |
| 111 | 01111111 | 10000000 |

For an M-bit input word, $2^M-1$ thermometer coded signals are required, for example for a 3-bit input word, 7 thermometer coded signals are required. A binary-to-thermometer encoder is such that the number of bits turned on at its output is the same as the numeric value presented at its input.

The first switches 10 thus switch current from activated current sources 6 through cascode transistor MC1 to an output node $N_{OUT}$.

A first switch 10 is controlled by a thermometer code delivered by a binary-to-thermometer converter part of a first converting means 9. A second switch 12 of the two way switches 8 is controlled by a code 1 of Nc, Nc being the number of coarse currents (Nc=$2^M$), which code is delivered by a binary-to-1-of-N converter which may also be, but does not need to be, part of the first converting means 9. The code 1 of Nc is illustrated in the table hereinabove in case of a 3-bit digital input signal. The second switches 12 switch the current of the first unselected current source of the coarse block 2 so as to flow into the fine block 4. Other unselected current sources are switched off to decrease current consumption.

Very careful routing of the ground node is needed to guarantee negligible ground shifts in the coarse current mirror. If not, the sources of different transistors forming the current sources are at a different voltage level, and the current sources will not deliver a same current as expected. When switching between coarse bits, the ground shifts will change (due to change of the current flowing through the ground connection) and monotonicity of the converter can be lost.

Alternatively, three way switches (not represented in the drawings) can also be used to improve accuracy. In that case, each three-way switch comprises a first, a second and a third switch. The first switch switches selected or activated current sources to the output node, the second switch switches the current of the first unselected current source to the fine block, and the third switch switches non-activated current sources to the supply, or preferably to a level substantially equal to $V_{ref}$. By switching current sources off instead of letting the current flow to a voltage level such the supply or $V_{ref}$, current consumption is saved. However, if the current sources are switched off and need to be switched on at a certain moment in time, more time is needed to settle the DAC because it is needed to charge the drains of the transistors forming said current sources and monotonicity could be influenced.

The output of the first unselected coarse bit is connected to the fine block 4, where the current is further divided by current division means, e.g. by means of current dividing transistors. When the DAC digital input signal is increased in such a way that the coarse bit value is increased by one, then the coarse bit, which was previously connected to fine bits input node $N_{fine}$ is now added to the other selected outputs on the output node N$_{coarse}$ and goes to the output via cascode MC1. The next coarse current source is taken as an input for the fine bits on node N$_{fine}$.

The fine block 4 is constructed as a linearly weighted current divider. This means that current coming in from the coarse block is equally divided e.g. by current dividing transistors, over the different branches 14 in the fine block 4. This principle makes the current DAC intrinsically monotonic. Each branch 14 of the fine block 4 is again provided with switching means, for example with two way switches 16. The two way switches 16 comprise a first switch 17 for switching the current of the corresponding current source to the output node N$_{OUT}$, and a second switch 18 for switching the current of the corresponding current source to a dummy node N$_{dummy}$.

The L least significant bits of the digital input signal are again thermometer coded in a binary-to-thermometer converter part of a second converting means 15 to provide a control signal for controlling the first switch 17 of the two way switches 16, as illustrated in the table below for a 3-bit input signal. The second switches 18 are controlled by an inverted converter part of the second converting means 15. This inverted converter outputs a control signal which is the inverse of the control signal outputted by the binary-to-thermometer converter, i.e. current from current sources not flowing to the output node N$_{OUT}$ is flowing to the dummy node N$_{dummy}$.

| Binary input | Thermometer output | Inversion |
|---|---|---|
| 000 | 0000000 | 1111111 |
| 001 | 0000001 | 1111110 |
| 010 | 0000011 | 1111100 |
| 011 | 0000111 | 1111000 |
| 100 | 0001111 | 1110000 |
| 101 | 0011111 | 1100000 |
| 110 | 0111111 | 1000000 |
| 111 | 1111111 | 0000000 |

For the fine block, if L least significant bits are to be coded, for the present embodiment $2^L-1$ current sources are needed, for example for a 3-bit digital input, 7 current sources are needed.

The switches 16 are used to connect the output of the fine block current dividers to the output node N$_{OUT}$ or to connect them to a dummy branch N$_{dummy}$ where the current may be dumped.

According to a second embodiment of the present invention, pulse width modulation (PWM) can be applied to the first unselected fine current source in order to increase or enhance resolution while substantially keeping the same number of current sources and switches, i.e. by substantially the same number of transistors. In fact, only a control signal and decoder (and one more switch) is needed in the fine conversion block compared to the first embodiment as explained above. In case PWM may be applied, the digital signal coming in comprises M+L+K bits, whereby the M more significant bits are used for controlling the switches of the coarse conversion block, the L less significant bits are used for controlling the switches of the fine conversion block, and the K least significant bits are used for controlling the PWM. The controlling of the switches of the coarse conversion block 2 and of the fine conversion block 4 is done as described in the first embodiment above, and is therefore not repeated in detail here.

The L least significant bits of the digital input signal are again thermometer coded in a binary-to-thermometer converter part of a second converting means 15 to provide a control signal for controlling the first switch 17 of the two way switches 16, as illustrated in the table below for a 3-bit input signal. The second switches 18 are controlled by an inverted converter part of the second converting means 15. This inverted converter outputs a control signal which is the inverse of the control signal outputted by the binary-to-thermometer converter, i.e. current from current sources not flowing to the output node N$_{OUT}$ is flowing to the dummy node N$_{dummy}$.

| Binary input | Thermometer output | Inversion | Bit for applying PWM |
|---|---|---|---|
| 000 | 00000000 | 11111111 | 00000001 |
| 001 | 00000001 | 11111110 | 00000010 |
| 010 | 00000011 | 11111100 | 00000100 |
| 011 | 00000111 | 11111000 | 00001000 |
| 100 | 00001111 | 11110000 | 00010000 |
| 101 | 00011111 | 11100000 | 00100000 |
| 110 | 00111111 | 11000000 | 01000000 |
| 111 | 01111111 | 10000000 | 10000000 |

For the fine block, if L least significant bits are to be coded, for the present embodiment $2^L$ current sources are needed, for example for a 3-bit digital input, 8 current sources are needed.

For the PWM, a modulation is applied to the first unselected current source of the fine block 4. For example, if there are K least significant bits in the digital input signal, which K least significant bits are used for applying the PWM, then the switches of the first unselected current source of the fine block are controlled so that current flows to the output node for $$\frac{X}{2^K}$$

of a time period, X depending on the value of the K least significant bits used for applying PWM. As an example, it is considered that 2 least significant bits of the digital input signal are used for applying PWM. In that case, depending on the value of those 2 least significant bits, the output of the PWM is as follows, i.e. the current of the first unselected current source is switched to the output node N$_{OUT}$ as follows:

| Binary input | PWM |
|---|---|
| 00 | 0 |
| 01 | ¼ |
| 10 | 2/4 |
| 11 | ¾ |

This means that, if the binary input is e.g. 01, the current of the first unselected current source is switched for ¼ of a period to the output node N$_{OUT}$, and for ¾ of a period to the dummy node N$_{dummy}$. If the PWM code, i.e. the value of the K least significant bits, is increased, this corresponds to switching the current of the first unselected current source to the output node N$_{OUT}$ for a longer time.

Applying PWM results in an output signal which has a DC value which has, at certain moments in time, a step on it. It is clear that, after filtering, the mean value of the analog output signal has risen.

According to a third embodiment, not represented in the drawings, current from the first unselected fine current source in the fine conversion block is fed to a current divider of a further, still finer, conversion block. PWM may then for example be applied to an unselected current source of this finer conversion block. The bits of the incoming digital signal need then to be divided so that a part of them control the switches of the coarse conversion block, another part control the switches of the fine conversion block, another part control the switches of the finer conversion block and still another part controls the PWM means.

To guarantee a low voltage drop, high output impedance and high precision, three active cascading loops are used. By using active cascading, better results are obtained on a smaller area, which is important both in view of precision and in view of miniaturisation of devices. Furthermore, the voltage at the output may change in a wide range. Because the transistors of the coarse conversion block are close to linear region, the output impedance decreases and the transistors are more sensitive to voltage variations on their drains. If instead of active cascading, passive cascading would be used, a bigger area would be needed because a separate cascoding transistor would be needed for each branch to be precise, and a lower output impedance would be obtained. Furthermore, passive cascoding is not good when switching the current.

The fine block 4 functions as an active cascode for the first unselected coarse bit, i.e. for cascading of the coarse current source which is connected to the fine current divider. This makes efficient use of the voltage available ("voltage room", e.g. 1 Volt) for delivering a correct output current. A first operational amplifier OA2 is provided, the positive input of which is coupled to node $N_{ref}$, which carries the reference voltage for the current mirror, which reference voltage is approximately equal to the voltage $V_{ref}$. The negative input of first amplifier OA2 is coupled to node $N_{fine}$. The output of the first amplifier OA2 is connected to the gates of the fine block current dividing transistors. The gate voltages of the current dividing transistors are thus regulated so that the voltage on node $N_{fine}$ is kept the same as the reference voltage $V_{ref}$. Voltage drops on switches inside the coarse block may be compensated by a dummy switch 19 inside the reference current branch.

Active cascoding (OA1, MC1) for the coarse block output current is used because of the high dynamic range of this current and the required precision. By doing this, a high output impedance, precision and monotonicity are ensured. A second operational amplifier OA1 is connected with its positive input to node $N_{fine}$, which is kept at the reference voltage $V_{ref}$ by means of the first operational amplifier OA2, and with its negative input to node $N_{coarse}$, and with its output to the gate of a cascading transistor MC1. This structure keeps the same voltage on the outputs of the coarse current sources connected to the output, node $N_{coarse}$, as is on the output of the first unselected current source which is connected into the fine current divider, node $N_{fine}$, i.e. also the same voltage as on node $N_{ref}$. An advantage of this structure compared to directly connecting the positive input of second operational amplifier OA1 to node $N_{ref}$ is that the voltage difference between nodes $N_{fine}$ and $N_{coarse}$ is given by the offset of second operational amplifier OA1 only, and is independent of the offset of the first operational amplifier OA2, but a structure with directly connecting the positive input of second operational amplifier OA1 to node $N_{ref}$ is also possible according to the present invention. The voltage difference between nodes $N_{fine}$ and $N_{coarse}$ is important to guarantee monotonicity. If the voltages on nodes $N_{fine}$ and $N_{coarse}$ would be different, the transistors forming the current sources would work in slightly different conditions, and monotonicity might be lost. This is mainly important when the coarse block current sources 6 work close to linear region. With monotonicity is meant that the output signal goes always up for higher input values. Furthermore, if the positive input of second amplifier OA1 would be connected to node $N_{ref}$, and positive input of first amplifier OA2 would be connected to $N_{coarse}$, then for currents below 1 coarse LSB, no current would be flowing through MC1 cascode, and the voltage on $N_{coarse}$ would not be correctly defined. This problem is solved by the interconnection scheme of the first and the second operational amplifier OA1, OA2 according to the present invention.

A third operational amplifier OA3 buffers the voltage on pin $N_{OUT}$ to node $N_{dummy}$. This is used to make the same conditions for all fine bit transistors, so that they all see the same voltage at their drains, which improves the accuracy. If they would see different voltages, then they would deliver different currents.

An advantage of the above circuit is that no additional cascodes are needed for each transistor in the coarse and fine block, which would lead to a need of much more voltage. Cascoding of the coarse block is done by transistor MC1 and the fine block 4 itself; cascading of the fine block is done by using a dummy node $N_{dummy}$ with the same voltage as is on node $N_{OUT}$. By using a circuit as explained above, the coarse and/or fine bit transistors can be used in a mode which is close to linear mode without loosing accuracy nor monotonicity.

A possible example of used separation of incoming digital bits between coarse and fine blocks 2, 4 and PWM is illustrated in FIG. 4. From an incoming 17-bit digital word, the MSB is a polarity bit, defining whether the incoming digital word has to go to a structure with elements of a first type, for example NMOS transistors, or to a same structure with elements of a second type opposite to the first type, for example PMOS transistors. The next seven MSBs are controlling the the coarse block 2. The next five bits are controlling the fine block. The four LSB are used for PWM.

A current mode DAC according to the present invention, as described above, has the following features:

current mode output high number of bits (e.g. 16 bits)

guaranteed monotonicity and no missing code over the full range; with missing code is meant that, for two different digital input values, the same analog output value is obtained and the maximum step on output when increasing input data by one is below 2 LSBs low voltage drop high output impedance high accuracy over the full range PWM modulation possible It is to be understood that although preferred embodiments, specific constructions and configurations, as well as materials, have been discussed herein for devices according to the present invention, various changes or modifications in form and detail may be made without departing from the scope and spirit of this invention. For example, the embodiment shown in FIG. 3 and described hereinabove is for a current sink DAC. It will be clear for a person skilled in the art that the polarity of the devices and the current can be changed so as to create a current source DAC.

The invention claimed is:

1. A monotonic digital-to-analog converter for converting a digital input signal into an analog output signal, the converter comprising:
   an input node for receiving the digital input signal having at least M+L bits,
   an output node for delivering the analog output signal corresponding to the received digital input signal,
   a coarse conversion block comprising current sources and first switching means for converting M more significant bits of the digital input signal into a coarse block output current,
   a fine conversion block comprising a current divider and second switching means for converting L less significant bits of the digital input signal into a corresponding current value, the fine conversion block having means for receiving current from a first of N unselected current sources of the coarse conversion block,
the monotonic digital-to-analog converter furthermore comprising:
   a first cascode means (OA1+MC1) for active cascading the coarse block output current, and
   a second cascode means (OA2) for active cascading the current from the first unselected current source.

2. The monotonic digital-to-analog converter according to claim 1, a first switching means being associated with a current branch, wherein the first switching means consist of two switching devices with three states on the associated current branch, or of three-way switches.

3. The monotonic digital-to-analog converter according to claim 1, wherein the second to Nth unselected current sources are switched off.

4. The monotonic digital-to-analog converter according to claim 1, wherein the coarse conversion block comprises linearly weighted current sources.

5. The monotonic digital-to-analog converter according to claim 1, wherein the fine conversion block comprises a linearly weighted current divider.

6. The monotonic digital-to-analog converter according to claim 1, wherein the converter is furthermore provided with means for applying pulse width modulation (PWM) to a first unselected fine bit.

7. A monotonic digital-to-analog converter according to claim 1, furthermore comprising an output follower loop (OA3) for buffering the voltage on the output node.

8. A method for converting a digital value comprising at least M+L bits into an analog value, the method comprising:
   selecting a first number of current sources in the coarse conversion block, said first number depending on the value of M more significant bits of the digital value,
   switching current of the selected first number of current sources to an output node,
   switching current from a first unselected current source in the coarse conversion block to a fine conversion block,
   dividing the current from the switched unselected current source over a current divider in the fine conversion block,
   selecting a second number of current outputs in the fine conversion block, said second number depending on the value of L less significant bits of the digital value,
   switching current of said selected current sources in the fine conversion block to the output node,
   active cascading the coarse block output current, and
   active cascading the current of a first of N unselected current sources in the coarse conversion block.

9. The method according to claim 8, further comprising applying pulse width modulation on current from an unselected current output in the fine conversion block, and switching this pulse width modulated current to the output node.

10. The method according to claim 8, furthermore comprising switching off the second to Nth unselected current sources in the coarse conversion block.

11. The method according to claim 8, wherein dividing the current from the switched unselected current source in the coarse conversion over a current divider in the fine conversion block comprises linearly weighted dividing said current.

12. The method according to claim 8, furthermore comprising buffering a voltage on the output node.

* * * * *

UNITED STATES PATENT AND TRADEMARK OFFICE
CERTIFICATE OF CORRECTION

PATENT NO. : 7,026,971 B2
APPLICATION NO. : 10/810328
DATED : April 11, 2006
INVENTOR(S) : Pavel Horsky and Ivan Koudar It is certified that error appears in the above-identified patent and that said Letters Patent is hereby corrected as shown below:

Column 11:

Line 21, "cascading" should be --cascoding--;
Line 23, "cascading" should be --cascoding--;

Column 12:

Line 22, "cascading" should be --cascoding--;
Line 23, "cascading" should be --cascoding--.

Signed and Sealed this

Fourth Day of July, 2006

JON W. DUDAS
*Director of the United States Patent and Trademark Office*